(12) United States Patent
Tomita et al.

(10) Patent No.: US 6,181,145 B1
(45) Date of Patent: Jan. 30, 2001

(54) PROBE CARD

(75) Inventors: Yasuhiro Tomita, Toyonaka; Seiji Yamaguchi, Hirakata, both of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/170,634

(22) Filed: Oct. 13, 1998

(30) Foreign Application Priority Data

Oct. 13, 1997 (JP) .................................................. 9-278363

(51) Int. Cl.[7] ...................................................... G01R 31/02
(52) U.S. Cl. ............................................ 324/754; 324/760
(58) Field of Search .................................. 324/754, 755, 324/765, 760, 761; 439/482, 842

(56) References Cited

U.S. PATENT DOCUMENTS

| 4,906,920 | 3/1990 | Huff et al. . | |
|---|---|---|---|
| 5,148,103 | * 9/1992 | Pasiecznik, Jr. | 439/482 |
| 5,180,977 | 1/1993 | Huff . | |
| 5,436,568 | 7/1995 | Woith . | |
| 5,764,070 | * 6/1998 | Pedder | 324/754 |
| 5,973,504 | * 10/1999 | Chong | 324/754 |

FOREIGN PATENT DOCUMENTS

| 2-253168 | 10/1990 | (JP) . |
|---|---|---|
| 8-83824 | 3/1996 | (JP) . |
| 9-252031 | 9/1997 | (JP) . |
| 10-12679 | 1/1998 | (JP) . |

OTHER PUBLICATIONS

Masoud Zargari et al., "A BiCMOS Active Substrate Probe Card Technology for Digital Testing", ISSCC96 Technical Digest, pp. 308–309, 1996 (unavailable month).

* cited by examiner

*Primary Examiner*—Vinh P. Nguyen
(74) *Attorney, Agent, or Firm*—Ratner & Prestia

(57) ABSTRACT

A probe card provides electrical connection between an IC device under test (DUT) and a testing apparatus. The probe card includes: a test chip for transferring a signal between the DUT and the testing apparatus; and a contact bump provided at a position corresponding to a pad of the test chip, wherein the test chip is provided to securely press the contact bump against the DUT, thereby establishing the electrical connection between the DUT and the contact bump.

17 Claims, 15 Drawing Sheets

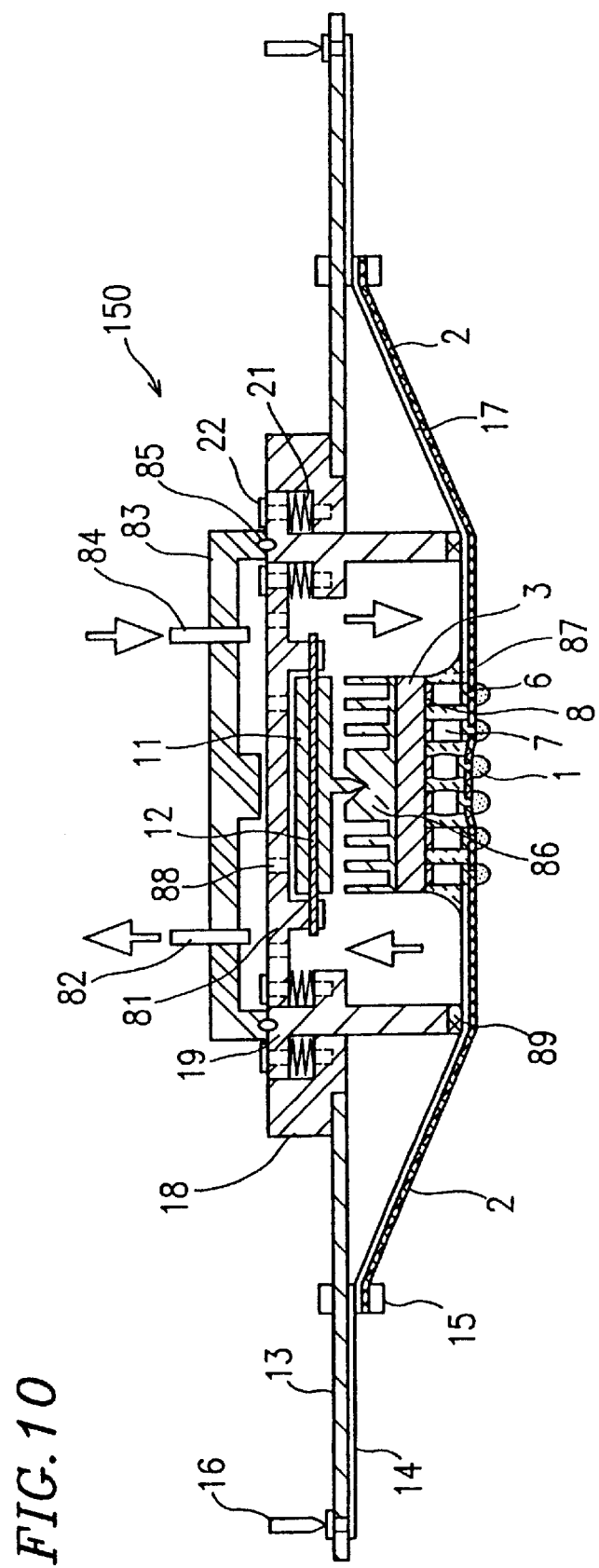

PROBE CARD

BACKGROUND OF THE INVENTION

1. Field of the Invention

The present invention relates to a probe card for use in a test of an IC (integrated circuit) device in the form of a wafer, a die, etc. More particularly, the present invention relates to a probe card which uses a wiring pattern on a membrane to provide electrical connection between test channels of a testing apparatus and signal terminals of an IC device under test (hereinafter, also referred to as a "DUT").

2. Description of the Related Art

Recent advancement in semiconductor microfabrication has allowed a higher-speed, multiple-pin, high-performance IC device to be formed within a small area. Recent trend toward smaller portable equipment has demanded a smaller-volume mounting package for IC devices, and some small packages are already in practical use, such as CSP (Chip Scale Package) which employs a flip chip mounting method. Moreover, in order to meet the demand for a device realizing a smaller size with more pins, an "area pad" device has recently been proposed in which bonding pads (hereinafter, also referred to simply as "pads") are provided not only in the periphery of the device but over the entire surface of the device.

A probe card used for testing such IC devices is required to be capable of providing a very accurate waveform to, and rapidly and accurately reading a waveform from, the IC device via the densely-arranged pads.

Conventional probe cards can be generally classified into a needle type probe card having a pad connecting section formed of tungsten needles, and a membrane type probe card having a pad connecting section configured using microstrip-line signal wiring and tungsten contact bumps. While the needle type probe card is the mainstream in the industry, the use of the membrane type probe card is growing in recent years as the demand for high-speed, multiple-pin IC devices grows.

Examples of the conventional probe card have been described in, for example, U.S. Pat. No. 4,906,920, and "A BiCMOS Active Substrate ProbeCard Technology for Digital Testing" on ISSCC 1996 Technical Digest, p. 308. The former describes a method for ensuring the electrical connection of contact bumps. The latter describes a method for providing a test chip in the vicinity of contact bumps in order to realize high-speed testing. The test chip serves as an interface between a DUT and a testing apparatus by buffering test data from the DUT and compensating for the function of the testing apparatus (e.g., an LSI test system).

With the conventional membrane type probe, however, it is difficult to ensure the electrical connection of the contact bumps. Thus, it is required to establish satisfactory electrical connection between the DUT and the pads even when heights of the contact bumps provided on the membrane vary.

Moreover, when using the conventional membrane type probe, it is difficult to realize a high-speed testing due to physical distance from the testing apparatus. In order to test a multiple-pin DUT at a high speed, a novel structure is needed for placing the test chip closer to the contact bumps so as to obtain the satisfactory electrical connection. Typically, however, a length of a printed board section is several tens of centimeters, and a length of the pad connection section is several centimeters, whereby an electrical length (transmission time) Td for a signal from a tester channel to the pad of the DUT is several nanoseconds. In order to reduce the transmission time Td, the distance between the tester channel to the DUT needs to be further reduced.

However, a conventional testing apparatus (LSI test system) capable of testing a multiple-pin DUT is costly, and large in size and must therefore be placed distant from the DUT.

Moreover, the number of tester channels which can be obtained by the state-of-the-art technology is about 1000, being less than the number of pins which can be provided on an area pad device. As a result, the design of a semiconductor IC device is limited by the number of pins on the test apparatus.

SUMMARY OF THE INVENTION

A probe card of the present invention provides electrical connection between an IC device under test (DUT) and a testing apparatus. The probe card includes: a test chip for transferring a signal between the DUT and the testing apparatus; and a contact bump provided at a position corresponding to a pad of the test chip, wherein the test chip is provided to securely press the contact bump against the DUT, thereby establishing the electrical connection between the DUT and the contact bump.

In particular, a probe card further includes a membrane provided between the contact bump and the test chip, wherein: the membrane has wiring for electrically connecting the contact bump, the test chip and the testing apparatus to one another; and the test chip securely presses the contact bump against the DUT from a reverse side of the membrane.

In one embodiment, a bump electrode is provided on the reverse side of the membrane so as to be connected to the contact bump; the test chip is flip-chip mounted to the bump electrode with a connection bump; and height variation among the contact bumps is compensated for by a change in height of the connection bump resulting from deformation thereof, whereby an uneven surface defined by tips of the contact bumps is aligned with a surface defined by the pads of the DUT.

The uneven surface defined by tips of the contact bumps may be pre-fixed so as to be aligned with the surface defined by the pads of the DUT.

In another embodiment, a bump electrode is provided on the reverse side of the membrane so as to be connected to the contact bump; the test chip is flip-chip mounted to the bump electrode via a bumper electrode array including an insulative elastic body and a plurality of relay electrodes running through the insulative elastic body; and height variation among the contact bumps is compensated for by the bumper electrode array having a variable thickness, whereby an uneven surface defined by tips of the contact bumps is aligned with a surface defined by the pads of the DUT.

In one embodiment, a probe card further includes: a test chip securing plate provided on a reverse surface of the test chip; and a securing plate holding mechanism for supporting the test chip securing plate, wherein the securing plate holding mechanism is supported about a rotational axis perpendicular to a longitudinal direction of the pads of the DUT.

The securing plate holding mechanism may support the test chip securing plate at a center of gravity of the pads of the DUT.

A probe card may further include a temperature control section provided on the test chip securing plate, wherein the temperature control section is used to control a temperature of the test chip.

In one embodiment, a probe card further includes: a hermetic structure provided on the reverse side of the membrane; and an insulative coolant filled in the hermetic structure into which the test chip is placed, wherein temperature control for the membrane and the test chip is performed by controlling a temperature of the coolant.

In one embodiment, the test chip includes: a plurality of tester channel pads to which a plurality of tester channels of the testing apparatus are connected, respectively; a plurality of device channel pads connected to the contact bumps, respectively; and a tri-state buffer, wherein one of the tester channel pads which is used only for inputting a signal to the testing apparatus and another one of the tester channel pads which is only used for outputting a signal from the testing apparatus are connected to one of the device channel pads via a tri-state buffer as a pair of the tester channel pads; and a tri-state control input for the tri-state buffer is connected to the tester channel pad and is controlled directly by the testing apparatus.

A load circuit may be connected to the device channel pad in the test chip.

The test chip may include: a plurality of bi-directional multiplexers for selectively connecting signals from the tester channel pads to the plurality of device channel pads; and a selection signal generation circuit for receiving the signals from the tester channel pads as an input and providing a selection signal to the bi-directional multiplexers.

In one embodiment, a signal latch circuit is connected to the device channel pad for storing a signal on the device channel pad; and the signal latch circuit is selectively disconnected from the device channel pad in response to the selection signal from the selection signal generation circuit.

In one embodiment, the selection signal generation circuit of the test chip includes a bit width conversion circuit and a memory circuit; the bit width conversion circuit increases a bit width of data to be input to the tester channel pad and writes the data in the memory circuit; the selection signal is generated from an output of the memory circuit; and an address signal of the memory circuit is input through the tester channel pad.

With the probe card of the present invention having the above-mentioned structure, the contact bumps are pressed against the DUT by the test chip, thereby electrically connecting the test chip and the DUT at the minimum distance. Accordingly, the time delay of a signal being transferred from the test chip to the DUT is minimum, thereby making it possible to test operating characteristics of a high-speed DUT.

A test circuit including a test pattern generation circuit and the like can be provided in the test chip, so as to perform the operation test of the DUT by the test chip and to return the test results to the testing apparatus (LSI test system), thereby reducing the number of tester channels required for the testing apparatus. Thus, using the testing apparatus with fewer tester channels, it is possible to test a multiple-pin IC device, at reduced cost, which cannot be otherwise tested with the conventional testing apparatus.

By using a microstrip line to form the wiring on the membrane, it is possible to establish impedance matching between the contact bumps and the testing apparatus, thereby stabilizing signal waveforms and enabling accurate testing. A photolithography technique can be used to provide the microstrip line on the membrane, thereby allowing a fine wiring pattern to be formed and facilitating the wiring process even when there is an increased number of contact bumps.

When a connection bump (for providing electrical connection between a bump electrode connected to a contact bump on the front surface of the membrane and the test chip) is made of a conductive material having a high elasticity, the height of the connection bump changes when the contact bumps are pressed against the DUT. Thus, the tips of the contact bumps are aligned with the plane defined by the pads of the DUT, resulting in satisfactory electrical connection even when the heights of the contact bumps deviate.

In accordance with the present invention, the connection bumps may be hardened while applying a predetermined load in such a condition that the tips of the contact bumps align with the plane defined by the pads of the DUT to provide a uniform contact across the contact bumps. Thus, it is not required to apply load for obtaining electrical contact of the contact bumps, whereby the load caused by the contact bumps on the DUT can be more uniform.

In the case where a flexible bumper electrode array is inserted between the test chip and the bump electrodes connected to the contact bumps on the front surface of the membrane, the height of the bumper electrode array changes locally when the contact bumps are pressed against the DUT. Thus, the tips of the contact bumps are automatically aligned with the plane defined by the pads of the DUT, whereby a uniform contact can be obtained irrespective of the material or height of the bumps even when there is a height variation among the contact bumps.

In the case where the test chip is pressed via the test chip securing plate, a uniform load is applied on the reverse surface of the test chip, thereby preventing the test chip from being damaged.

When the securing plate holding mechanism for securing the test chip securing plate is rotatably supported about a rotation axis extending perpendicular to the longitudinal direction of the pad of the test chip, the contact bumps slightly slide on the pads of the DUT in the longitudinal direction thereof as the contact bumps are pressed against the DUT by the securing plate holding mechanism. This scribe process scribes off an oxide film formed on the surface of the DUT pad, thereby exposing the conductive portion of the pad. In this way, it is possible to establish a low-resistance connection even with the contact bumps formed on the membrane. When the scribe process is performed in the longitudinal direction of the pads, a large margin can be afforded for aligning the contact bumps with respect to the DUT pads.

In the case where the securing plate holding mechanism supports the test chip securing plate at the center of gravity of the pad array of the DUT (i.e., the center of gravity of the contact pad array), a uniform load can be applied on the DUT pads, thereby providing a uniform load of the contact bumps.

When the temperature of the test chip is controlled by providing the test chip securing plate with the temperature control section, the heat release section provided on the test chip securing plate can adhere on the reverse side of the test chip, thereby allowing for heat exchange via the reverse side of the test chip. In this way, the temperature of the test chip can be maintained at a desired constant temperature, thereby fixing the temperature condition of the test chip during the testing and thus allowing for an accurate test.

In the case where the insulative coolant is used while controlling the temperature thereof, the membrane and the test chip are maintained at a constant temperature by directly contacting the temperature-controlled insulative coolant. The DUT is also maintained at the constant temperature due to the heat conduction by the contact bump. Thus, it is possible to test various temperature-depending characteristics of the DUT. Moreover, the temperature of the membrane and the test chip can be controlled with a large heat capacity, thereby widening the possible temperature control range and thus allowing the intended temperature to be reached within a short time. On the other hand, rapid temperature changes can be suppressed, thereby minimizing the possible heat stress of the membrane.

An output signal and an input signal at I/O pads (also called "bi-directional pads") of the DUT connected to the contact bumps can be connected via the tri-state buffer to independent tester channels, respectively. In such a case, it is possible to successively switch between the signal strobing and the signal driving by the I/O pads of the DUT. In this way, upon the testing of I/O signals (bi-directional signals) using a single signal tester channel, a dead zone having a time interval of 2Td occurring in conventional examples does not occur. Thus, it is possible to test operating characteristics of the DUT in which I/O switching rapidly takes place.

The tri-state control input of the tri-state buffer connected to the tester channel pad which is used only for outputting a signal to the testing apparatus is controlled so as to be always driven during the testing of the operating characteristics of the DUT. On the other hand, the tri-state control input of the tri-state buffer connected to the tester channel pad which is used only for receiving a signal from the testing apparatus is controlled so as to have a high impedance while the DUT is in an output condition. Thus, it is possible to avoid collision of the output from the testing apparatus and the output from the DUT.

Moreover, when the tri-state control input of the tri-state buffer connected to the tester channel pad which is used only for outputting a signal to the testing apparatus is controlled so as to have a high impedance, all the tester channel pads of the test chip can have the same impedance (i.e., all the tester channel pads become open-ended). Thus, it is possible to facilitate the test of a time delay due to a reflected wave between the tester channel of the testing apparatus and the tester channel pad.

In the case where a load circuit is connected to the device channel pad of the test chip, the load circuit is electrically separated from the test channel by the tri-state buffer. Thus, there is no influence on the measurement of the time delay of the tester channel of the testing apparatus using a reflected wave at the tester channel pad. Moreover, in the above case, the waveform of a signal which is input to, or output from, the DUT is shaped by a terminating circuit and the load circuit. Thus, it is possible to improve the measuring frequency with which the DUT is tested and to define the test conditions.

When the test chip is provided with a plurality of bi-directional multiplexers and a selection signal generation circuit each having a predetermined function, a single tester channel can be shared by a plurality of device channels in a time division manner by switching the connection of the bidirectional multiplexer. Therefore, it is possible to reduce the number of tester channels required for the testing apparatus. Moreover, the control signal from the testing apparatus to the bi-directional multiplexer is generated in the selection signal generation circuit. Thus, it is possible to switch the connection of the bi-directional multiplexer in real time during a test.

In the case where a signal latch circuit having a predetermined function is used, a signal on the device channel pad is stored in the signal latch circuit. When the bi-directional multiplexer is switched to disconnect the device channel pad from the tester channel, an input signal is applied to the device channel pad. On the other hand, when the bi-directional multiplexer is switched to connect the device channel pad to the tester channel, a signal on the device channel pad is selectively stored based on the connection selection signal. In this way, a single tester channel can be shared by a plurality of device channels in a time division manner, and thereby to reduce the number of test channels required for the testing apparatus. When a connection selection signal from the testing apparatus to the signal latch circuit is generated by the selection signal generation circuit, it is possible to switch, in real time, a signal storing timing or a signal fixing timing during a test.

When the selection signal generation circuit is provided with a bit width conversion circuit and a memory circuit each having a predetermined function, data prestored in the memory device is read out by using an address signal from the testing apparatus in the selection signal generation circuit, thereby generating a selection signal. In this way, it is possible to arbitrarily alter the correspondence between the address signal and the selection signal and to further reduce the number of tester channels required for selection signal generation. Alternatively, it is also possible to reduce the number of tester channels required for the testing apparatus by writing selection signal data of the selection signal generation circuit from the testing apparatus to the memory circuit via the bit width conversion circuit.

Thus, the invention described herein makes possible the advantage of providing a probe card for an integrated circuit (IC) device, capable of testing operating characteristics of a high-speed, multiple-pin IC device, which realizes satisfactory contact characteristics and a testing of pads which perform high-speed I/O processes.

This and other advantages of the present invention will become apparent to those skilled in the art upon reading and understanding the following detailed description with reference to the accompanying figures.

BRIEF DESCRIPTION OF THE DRAWINGS

FIG. 10 is a schematic cross-sectional view illustrating alternative probe card structure according to the present invention which includes a temperature control mechanism;

DESCRIPTION OF THE PREFERRED EMBODIMENTS

Figure 1A:
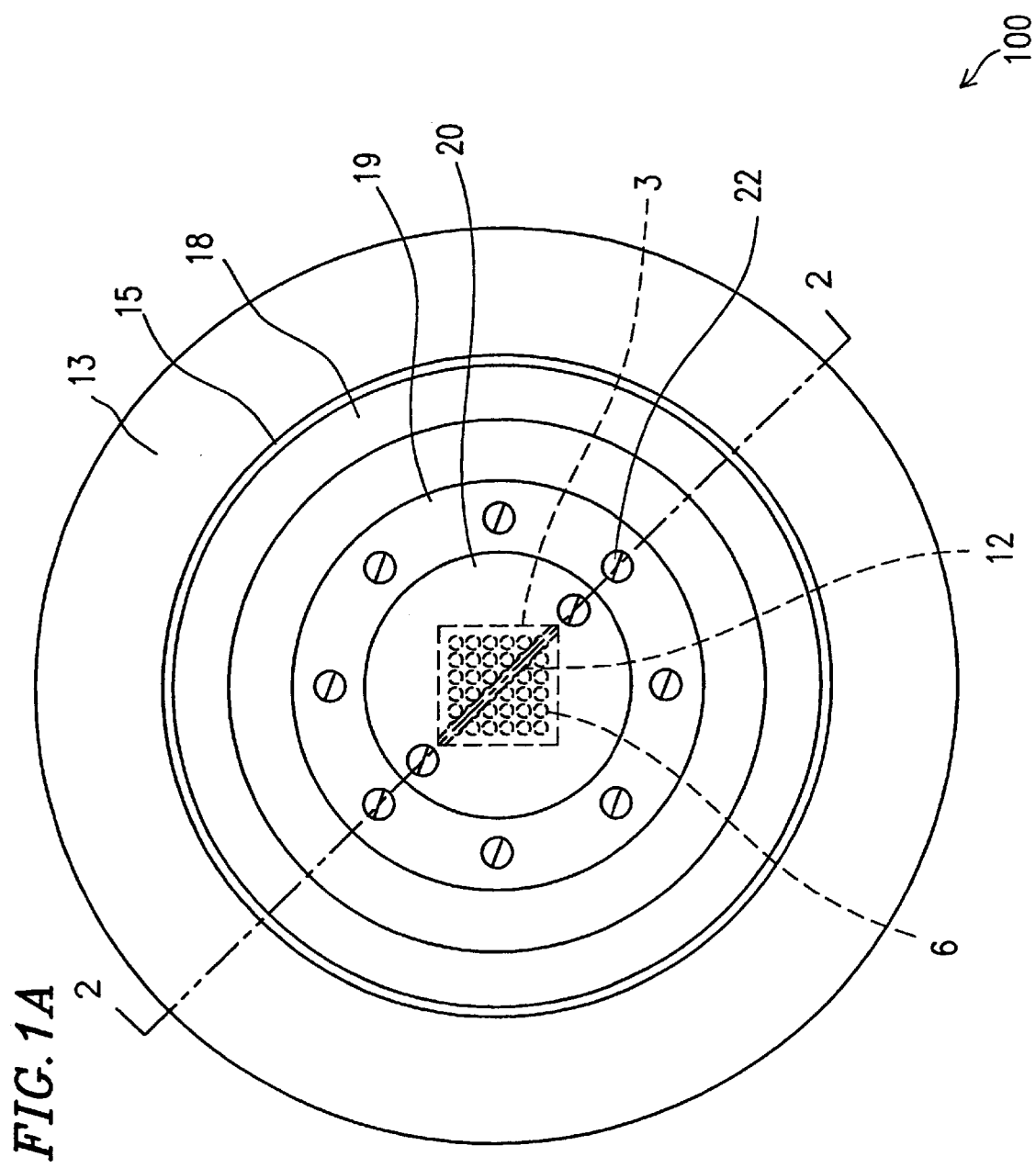
FIG. 1A is a top view illustrating a probe card for an IC device according to an example of the present invention.
Figure 1B:
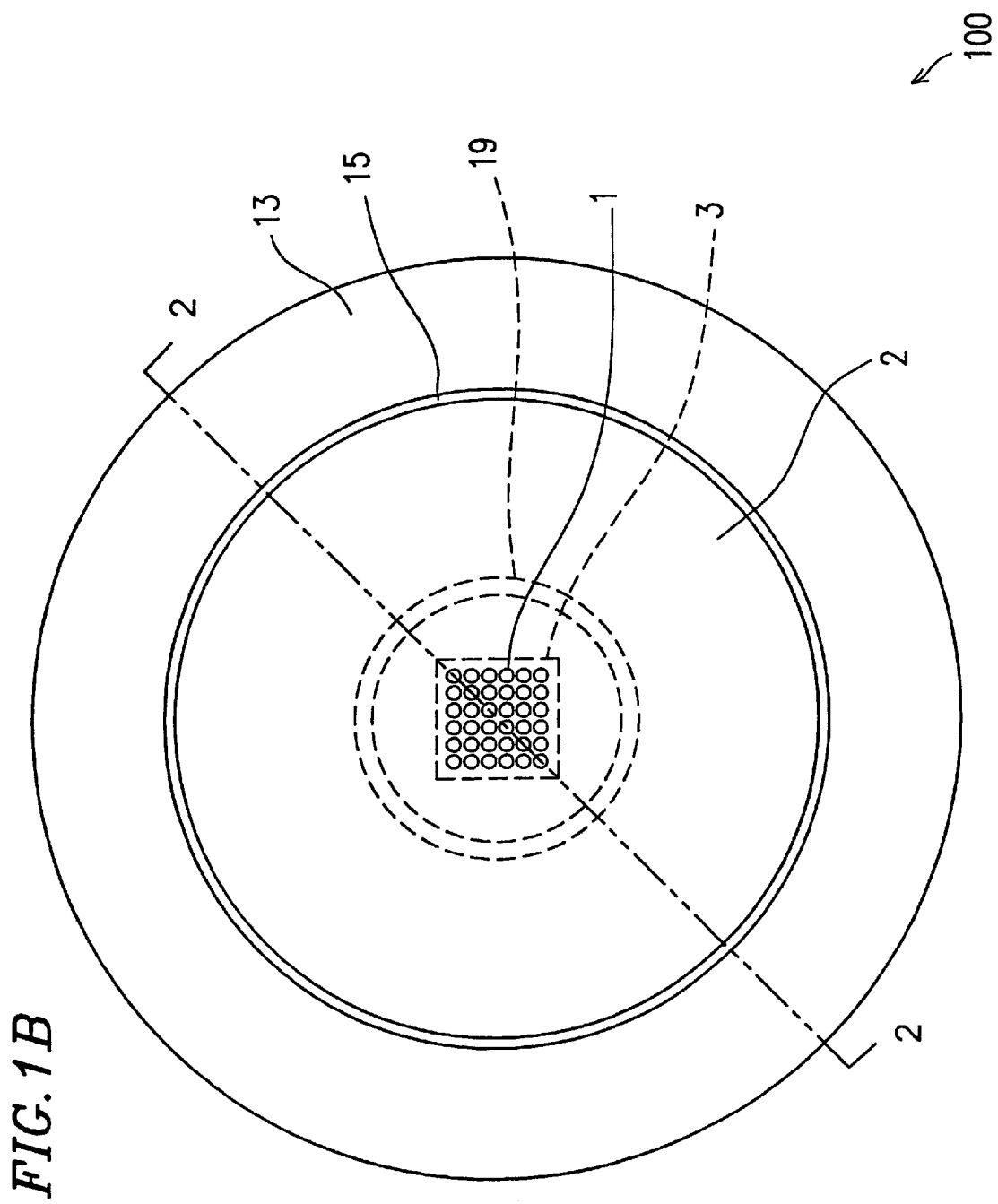
FIG. 1B is a bottom view illustrating a probe card for an IC device according to an example of the present invention.
Figure 2:
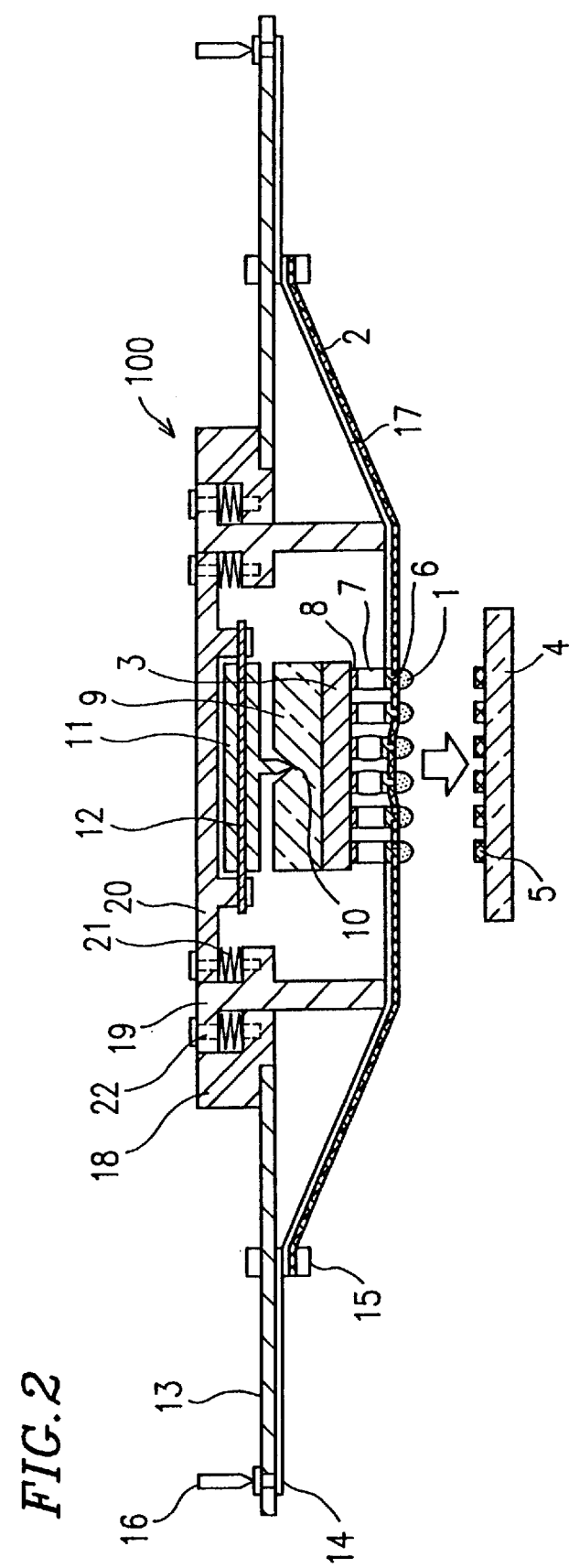
FIG. 2 is a cross-sectional view taken along line 2—2 of FIGS. 1A and 1B illustrating a probe card and an IC device under test (DUT) to be tested by the probe card.
Figure 3:
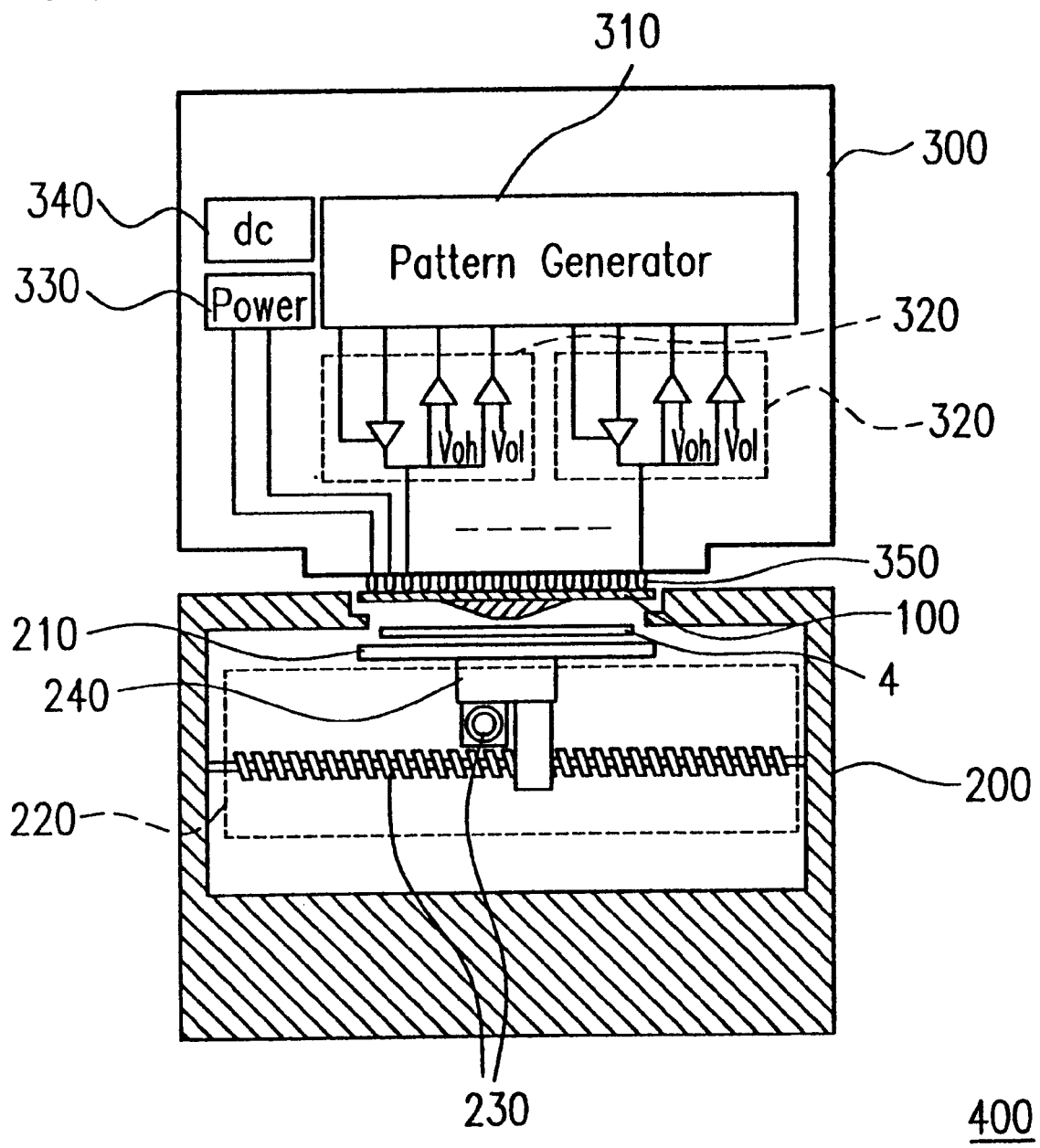
FIG. 3 is a schematic diagram illustrating a testing apparatus incorporating the probe card of FIGS. 1A to 2.

FIGS. 1A and 1B are a top view and a bottom view, respectively, illustrating an IC device probe card 100 according to an example of the present invention. FIG. 2 is a cross-sectional view of the probe card 100 taken along line 2—2 of FIGS. 1A and 1B. FIG. 2 also illustrates an IC device (DUT) 4 whose operating characteristics are under test by the probe card 100. FIG. 3 is a schematic view illustrating a testing apparatus 400 which incorporates the probe card 100 of the present invention.

The basic principle of how to test the operating characteristics of the DUT 4 according to the present invention will now be described.

The probe card 100 for providing electrical connection between the DUT 4 and the testing apparatus 400 includes a plurality of contact bumps 1 and a test chip 3 for transferring signals between the contact bumps 1 and the testing apparatus 400. Various functions for testing the DUT 4 are integrated into the test chip 3. The test chip 3 is provided with test chip pads 8 for providing the electrical connection with the contact bumps 1. The test chip pads 8 positionally correspond to the contact bumps 1, respectively. The contact bumps 1 are connected to bump electrodes 6 which also positionally correspond to the contact bumps 1, respectively. The bump electrodes 6 are connected, in turn, to the test chip pads 8 via bumps (connection bumps) 7, respectively.

The contact bumps 1 are pressed against, and secured on, electrical connection pads 5 on the DUT 4 by the test chip 3, thereby establishing electrical connection therebetween.

In such a structure, the test chip 3 and the DUT 4 are connected together over a very small distance (e.g., several hundred micrometers) corresponding to a total thicknesses of the contact bumps 1, the membrane 2 and the connection bumps 7. As a result, the time delay between the test chip 3 and the DUT 4 is very short, whereby it is possible to test the operating characteristics of even a high-speed DUT 4.

A probe card employing a test chip has been already proposed in the conventional art. However, such a conventional test chip is disposed, not directly above the DUT, but at a position horizontally shifted from being directly above the DUT. Furthermore, the establishment of electrical connection between the contact bumps and the electrical connection pads on the DUT by pressing the contact bumps against, and secured on, the pads of the DUT through the application of a load via the test chip, has not been conventionally performed in view of concerns that some adverse effects may occur on the operating characteristics of the test chip.

When testing the operating characteristics of the DUT 4, the probe card 100 of the present invention is incorporated into the testing apparatus 400 as illustrated in FIG. 3. The testing apparatus 400 includes a wafer probing system 200 and a VLSI test system 300.

The wafer probing system 200 includes a wafer chuck 210 for fixing a wafer on which a plurality of DUTs 4 are provided in a matrix arrangement. The wafer probing system 200 also includes an X-Y stage 220 for moving the wafer chuck 210 in the X and Y directions with guiding screws 230, a rotator for rotating the wafer chuck 210, and a Z-axis up-and-down mechanism for vertically moving the wafer chuck 210. In this example illustrated in FIG. 3, the rotator and the Z-axis up-and-down mechanism are provided as an integrated component (indicated by reference numeral 240 in FIG. 3). These mechanisms are used to move the wafer chuck 210 so that an intended DUT 4 on the wafer is positioned directly under the probe card 100, thereby electrically connecting the DUT 4 to the probe card 100.

The VLSI test system 300 includes a pattern generator 310 for generating an input pattern and an expected output value, pin electronics components 320 for transferring data between the pattern generator 310 and the DUT 4, a power supply 330 and a DC unit 340 for testing various DC characteristics of the DUT 4.

Signals of the VLSI test system 300 are commonly called "tester channels", which include a tester channel for supplying power to the DUT 4 and another tester channel for transferring signals to and from the DUT 4. The tester channel for signal transfer is implemented by the pin electronics components 320. Each pin electronics component 320 includes a driver for driving the DUT 4 based on data from the pattern generator 310, and a comparator for comparing the output from the DUT 4 with reference voltages (e.g., Vol and Voh) of the expected logical values and for providing the comparison results back to the pattern generator 310. The tester channels of the VLSI test system 300 are electrically connected to the probe card 100 via tester channel contacts 350 and, in turn, to the DUT 4 on the wafer fixed by the wafer chuck 210 of the wafer probing system 200.

A housing (commonly referred to as a "test station") accommodating the pin electronics components 320 of the VLSI test system 300 is disposed at a position physically close to the wafer probing system 200 and electrically connected thereto.

The contact bumps 1 made of a hard metal such as tungsten are provided on a side of the membrane 2 facing the DUT 4. The membrane 2 is made of an insulative resin such as polyimide. The membrane 2 is also provided with microstrip-line wiring 17 (also simply referred to as the "microstrip line"). A high-speed operation is ensured particularly when each line in the microstrip-line wiring 17 is an iso-impedance line, i.e., lines having impedance equal to each other. Some of the bump electrodes 6 are connected to tester channel pins 16 of the testing apparatus 400 via the microstrip line 17 on the membrane 2, a microstrip line 14 on a printed board section 13 and a membrane connection section 15 connecting the microstrip lines 14 and 17 to each other.

Each of the tester channel pins 16 illustrated in FIG. 2 corresponds to a separate tester channel contact 350 (pin) illustrated in FIG. 3.

The contact bumps 1 can be classified into the following types (A) to (F) in terms of the signal transfer path.

(A) Dummy contact bump 1:

The dummy contact bump 1 is connected to the test chip 3 via a dummy bump electrode 6, the connection bump 7 and a dummy test chip pad 8 which is not electrically functional. The dummy contact bump 1 is used only to maintain a mechanical strength, and is not electrically functional. On the side of the DUT 4, the dummy contact bump 1 is in contact with an insulation film (not shown) or a dummy pad 5 which is not electrically functional.

(B) Power supply contact bump 1 for supplying power to the DUT 4 or the test chip 3:

The power supply contact bump 1 is electrically connected to the test chip 3 via a bump electrode 6 which is connected to the tester channel pin 16 for power supply, the connection bump 7 and a test chip pad 8 for supplying a power to the test chip 3. The connection line between the bump electrode 6 and the tester channel pin 16 is designed with a relatively large width so that the connection line has a low impedance.

For the DUT 4, the power supply contact bump 1 is in contact with the pad 5 for supplying power to the DUT 4. Alternatively, by providing the power supply contact bump 1 so as to be in contact with an insulation film (not shown) or a dummy pad 5 which is not electrically functional on the DUT 4, power can be supplied only to the test chip 3, not to the DUT 4.

Alternatively, power can be supplied only to the test chip 3 by not forming the corresponding contact bump 1 if mechanical strength can be afforded and if such a design does not adversely affect the electrical contact. When providing no corresponding contact bump 1, it is possible to suppress the potential damage to the DUT 4 resulting from being pressed by the contact bump 1.

(C) Contact bump 1 for connecting the signal pad of the test chip 3 with the signal pad of the DUT 4:

A contact bump 1 of this type is electrically connected to the test chip 3 via the bump electrode 6, the connection bump 7 and the signal pad 8 of the test chip 3. This connection path is the shortest path, and the integrity of a signal waveform is thus ensured.

(D) Contact bump 1 for connecting the signal tester channel pin 16 of the testing apparatus 400 with the signal pad of the test chip 3:

A contact bump 1 of this type is electrically connected to the test chip 3 via the bump electrode 6, the connection bump 7 and the signal pad 8 of the test chip 3. The bump electrode 6 is connected to the tester channel pin 16 via the microstrip line 17, the membrane connection section 15 and the microstrip line 14 in this order.

In order to supply a signal only to the test chip 3, on the side of the DUT 4, the contact bump 1 is provided so as to be in contact with an insulation film (not shown) or a dummy pad 5 which is not electrically functional. Alternatively, the signal can be supplied only to the test chip 3 by not forming the contact bump 1 if mechanical strength can be afforded and if such a design does not adversely affect the electrical contact.

(E) Contact bump 1 for connecting the signal tester channel pin 16 of the testing apparatus 400 with the signal pad of the DUT 4:

A contact bump 1 of this type is electrically connected to the test chip 3 via the bump electrode 6, the connection bump 7 and the pad 8 of the test chip 3 which is not electrically functional. On the side of the DUT 4, the contact bump 1 is connected to the signal pad 5. The bump electrode 6 is connected to the tester channel pin 16 via the microstrip line 17, the membrane connection section 15 and the microstrip line 14 in this order.

(F) Contact bump 1 for simultaneously connecting the signal tester channel pin 16 of the testing apparatus 400 with the signal pad of the test chip 3 and the signal pad of the DUT 4:

A contact bump 1 of this type is electrically connected to the test chip 3 via the bump electrode 6, the connection bump 7 and the signal pad 8 of the test chip 3. For the DUT 4, the contact bump 1 is connected to the signal pad 5. The bump electrode 6 is connected to the tester channel pin 16 via the microstrip line 17, the membrane connection section 15 and the microstrip line 14 in this order.

The electric contact between the contact bump 1 and the pad 5 of the DUT 4 is established by securely pressing the contact bump 1 by the test chip 3 which is flip-chip mounted.

Hereinafter, a structure for correcting the height of the contact bump 1; a method for ensuring the electrical connection between the contact bump 1 and the pad 5 of the DUT 4; a method for controlling the temperature of the probe card 100; and a structure of the test chip 3 will be described.

(Structure for correcting height of contact bump 1)

One goal to be achieved upon the fabrication of contact bumps on a membrane is to provide the respective contact bumps 1 with a uniform height. When contact bumps 1 designed to have a height of several ten micrometers are formed using a method such as plating, variation in height on the order of several micrometers will typically result. In order to ensure satisfactory electrical connection between the contact bump 1 and the pad 5 of the DUT 4, it is required to correct the variation in height across the contact bumps 1, thereby obtaining uniform electrical contact.

In a conventional membrane probing system, contact bumps are pressed down via an elastic body being inserted between the contact bumps and a membrane, so that the height variation among the contact bumps can be absorbed by the flexible thickness of the elastic body. In the present invention in which the contact bumps 1 are pressed down by the test chip 3, however, it is additionally required to maintain satisfactory electrical connection between the test chip 3 and the contact bumps 1.

An exemplary structure for correcting the height of the contact bumps 1 according to the present invention will now be described with reference to FIGS. 4A to 4D. FIGS. 4A to 4D are cross-sectional views illustrating the structure including the contact bumps 1, the membrane 2 and the test chip 3 under various conditions.

Figure 4A:
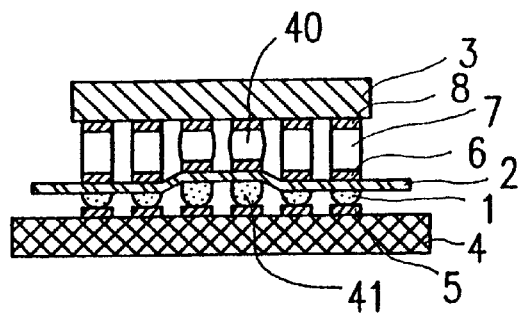
FIGS. 4A to 4D are cross-sectional views in the vicinity of contact bumps, a membrane and a test chip in FIG. 2, illustrating a method for correcting height variation among the contact bumps by deformation of bumps.

First, FIG. 4A illustrates a situation where the contact bumps 1 are in contact with the pads 5 of the DUT 4. Referring to FIG. 4A, some of the connection bumps 7 (e.g., connection bumps 40), corresponding to some of the contact bumps 1 (e.g., contact bumps 41) which are taller than the others, are deformed or compressed so that the tips of the contact bumps 1 and 41 are aligned with the plane defined by the pads 5 of the DUT 4.

The connection bumps 7 (40) made of a conductive material having a large elasticity deform when they contact the contact bumps 1. Alternatively, the deformed connection bumps 40 may be pre-deformed so that the relatively tall contact bumps 41 do not apply any extra load on the pads 5, thereby minimizing the potential damage to the pads 5 and an underlying structure.

Next, a method for making such a structure for correcting the height of the contact bumps 1 illustrated in FIG. 4A will be described with reference to FIGS. 4B to 4D.

Figure 4B:
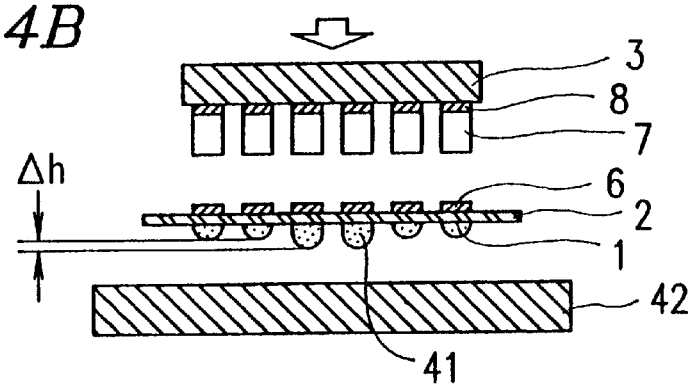

Referring to FIG. 4B, a surface plate 42 is provided which has a plane equivalent to the pads 5 of the DUT 4. As shown in FIG. 4B, the test chip 3 and the membrane 2 are not yet connected via the connection bumps 7, but are separated from each other. The contact bump 41 is taller than the surrounding other contact bumps 1 by Δh.

Figure 4C:
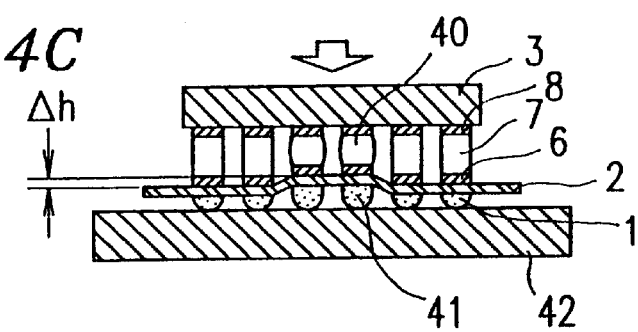

FIG. 4C illustrates a situation where the test chip 3 and the membrane 2 are connected together by pressing them against the surface plate 42, which has been heated to a high temperature so as to reduce the hardness of the connection bumps 7. The contact bumps 1 are made of an alloy of tungsten, nickel, or the like, and will not be deformed when in contact with the heated surface plate 42. The connection bumps 7, on the other hand, are made of a material, such as an alloy of solder, gold, or the like, a conductive resin, anisotropic conductive rubber, etc., whose softening point is equal to or greater than the upper limit temperature for testing the operating characteristics of the DUT 4. Thus, the connection bumps 40 corresponding to the taller contact bumps 41 deform when (indirectly) contacting the heated surface plate 42. The membrane 2 also deforms in the vicinity of the taller contact bumps 41 (and the corresponding connection bumps 40) by the difference in height Δh between the contact bumps 1 and 41.

Figure 4D:
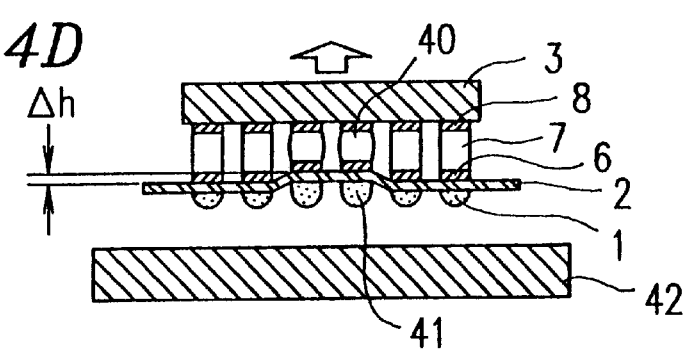

Then, after cooling the surface plate 42 to a room temperature, the contact bumps 1 are separated from the surface plate 42, as illustrated in FIG. 4D. The connection bumps 40 retain the deformed shape obtained when the contact bumps 1 are pressed against the heated surface plate 42. The membrane 2 also maintains the deformed shape by the deformed connection bumps 40. When the number of the connection bumps 7 provided is particularly small, a large stress may be applied at the connection between the membrane 2 and the connection bump 7 maintaining the deformation of the membrane 2. In order to avoid such a situation, dummy connection bumps 7 irrelevant to the electrical connection may be additionally provided to disperse the stress.

With such a structure, it is possible to align the tips of the contact bumps 1 with the uneven surface of the DUT 4.

(Alternative structure for correcting height of contact bump 1)

Figure 5A:
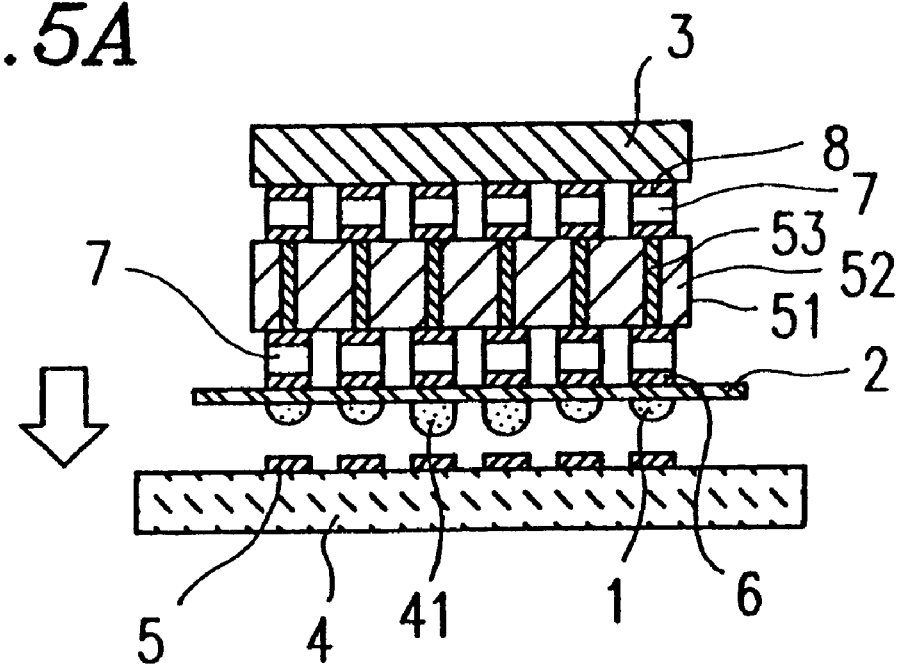
FIGS. 5A and 5B are cross-sectional views in the vicinity of the contact bumps, the membrane and the test chip in FIG. 2, illustrating a method for correcting height variation among the contact bumps by using a bumper electrode array.
Figure 5B:
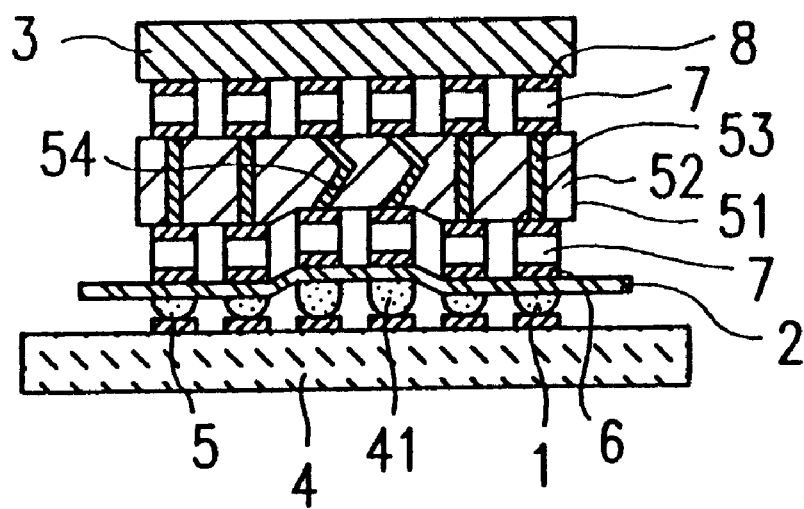

In the example illustrated in FIGS. 4A to 4D, the height variation among the contact bumps 1 is corrected by the deformation of the connection bumps 40. When the height variation among the contact bumps 1 is greater, however, a structure illustrated in FIGS. 5A and 5B is more preferable. FIGS. 5A and 5B are cross-sectional views illustrating the structure including the contact bumps 1, the membrane 2 and the test chip 3 under various conditions.

FIG. 5A illustrates the structure before the pads 5 of the DUT 4 are in contact with the contact bumps 1.

The illustrated structure employs a bumper electrode array 51 which includes an elastic body 52 and through electrodes 53 running through the elastic body 52. The test chip pads 8 of the test chip 3 are electrically connected to the bump electrodes 6 on the membrane 2 via the connection bumps 7, the through electrodes 53 and the other connection bumps 7. Referring to FIG. 5A, the contact bumps 41 taller than the surrounding other contact bumps 1 extend beyond the other contact bumps 1 since the membrane 2 is flat.

FIG. 5B illustrates the same structure when the contact bumps 1 are in contact with the pads 5 of the DUT 4. Referring to FIG. 5B, the taller contact bumps 41 cause a corresponding portion of the membrane 2 and corresponding ones of the through electrodes 53 to deform. In this way, the tips of the contact bumps 1 and 41 are aligned with the plane defined by the pads 5 of the DUT 4.

When the difference in height among the contact bumps 1 is even greater, a thicker elastic body 52 can be used. In the structure described referring to FIGS. 4A to 4D, when the difference in height Δh between the contact bumps 1 and 41 is so great, it is necessary to provide taller connection bumps 7. In contrast, a thicker elastic body 52 can more easily be obtained. Therefore, the structure illustrated in FIGS. 5A and 5B facilitate aligning the tips of the contact bumps 1 and 41 with the uneven surface of the DUT 4 even when there is a great height variation among the contact bumps 1 and 41. It is also possible to account for subsequent height variation due to abrasion or chip-off of the contact bumps.

Now, with reference to FIGS. 6A, 6B, 7A and 7B, an exemplary method for making the bumper electrode array 51 will be described.

Figure 6A:
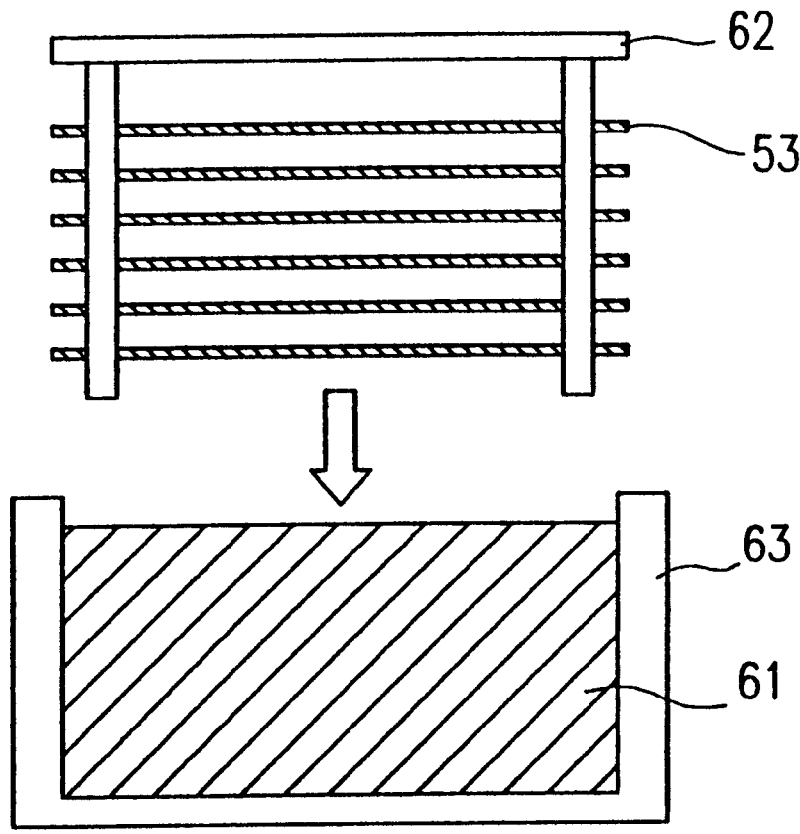
FIGS. 6A and 6B are cross-sectional views illustrating part of a process of making the bumper electrode array.

In this example, a silicone rubber is used as the elastic body 52. Referring to FIG. 6A, the through electrodes 53 made of tungsten, or the like, are strung across a supporting member 62 at a desired pitch. A container 63 is filled with a solution of silicone rubber 61 into which the supporting member 62 is to be dipped.

Figure 6B:
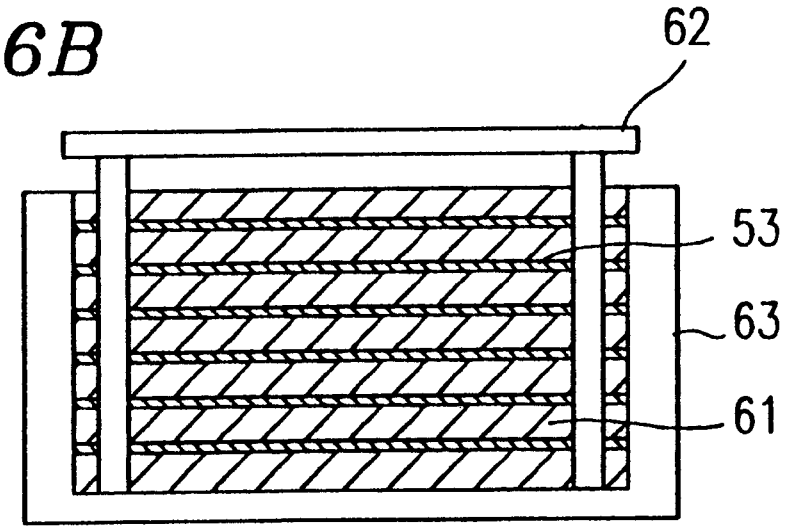

Referring to FIG. 6B, the supporting member 62 is then slowly dipped into the solution of silicone rubber 61. During this process, the pressure around the container 63 is preferably increased to remove bubbles between the through electrodes 53.

Figure 7A:
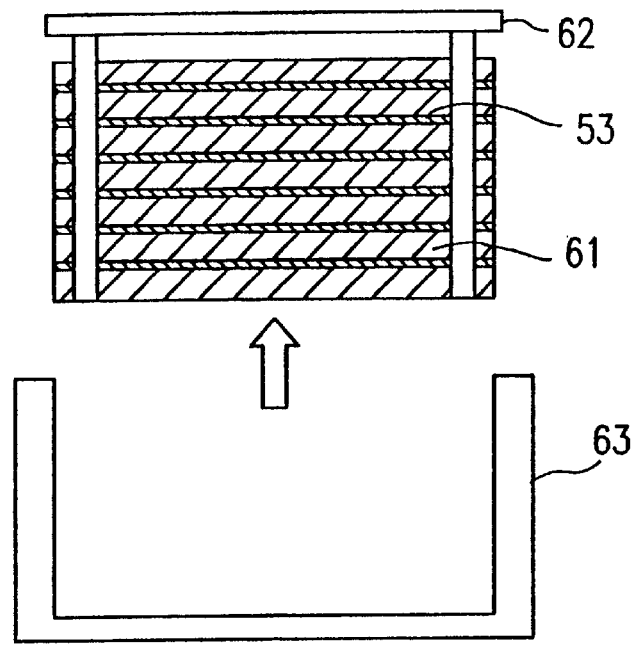
FIGS. 7A and 7B are cross-sectional views illustrating part of the process of making the bumper electrode array.

Referring to FIG. 7A, after the silicone rubber 61 is well cured, the supporting member 62 is pulled out of the container 63, accompanied by the cured silicone rubber 61.

Figure 7B:
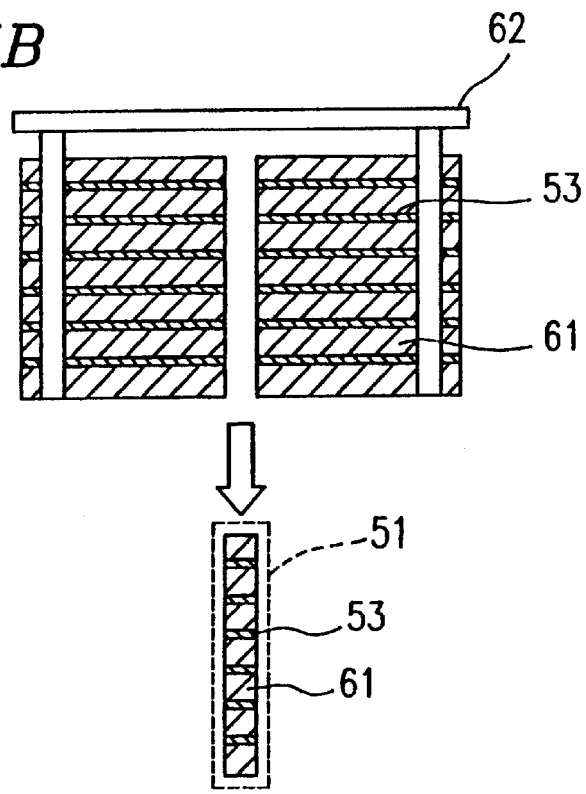

Finally, referring to FIG. 7B, a desired thickness of the bumper electrode array 51 is cut out from the supporting member 62 by using a laser beam, or the like.

Based on the above-described method, the bumper electrode array 51 having a thickness of several hundred micrometers to several millimeters can be easily made.

(Method for ensuring electrical connection)

When electrically connecting the contact bumps 1 to the pads 5 of the DUT 4, a low-resistance electrical connection is not likely to be obtained unless an oxide film on the surfaces of the pads 5 is broken (or scribed off). One possible way is to intentionally slide the contact bumps 1 on the surfaces of the pads 5 when making the connection, thereby breaking (or scribing off) the oxide film.

A method for restricting the sliding direction (a direction in which the contact bumps 1 are allowed to intentionally slide on the surfaces of the pads 5) in order to ensure the electrical connection between the contact bumps 1 and the pads 5 of the DUT 4 will now be described.

Referring back to FIG. 2, a first fixing ring 18 is fixed to the printed board section 13. A second fixing ring 19 is supported by screws 22 and springs 21 to be movable with respect to the first fixing ring 18. Similarly, a third fixing ring 20 is supported by the screws 22 and the springs 21 to be movable with respect to the first fixing ring 18. The second fixing ring 19 and the third fixing ring 20 apply a tension to the membrane 2, and slightly move when a force is applied to the contact bumps 1.

Figure 8A:
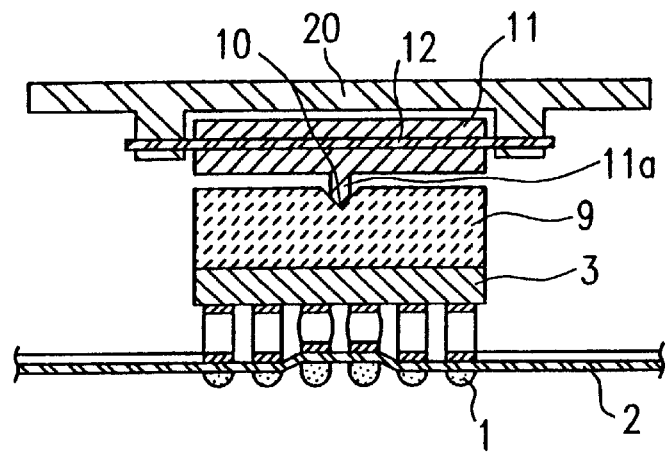
FIG. 8A is a schematic cross-sectional view illustrating a mechanism of a probe card for limiting a sliding direction of the contact bumps and thereby ensuring the electrical connection.
Figure 8B:
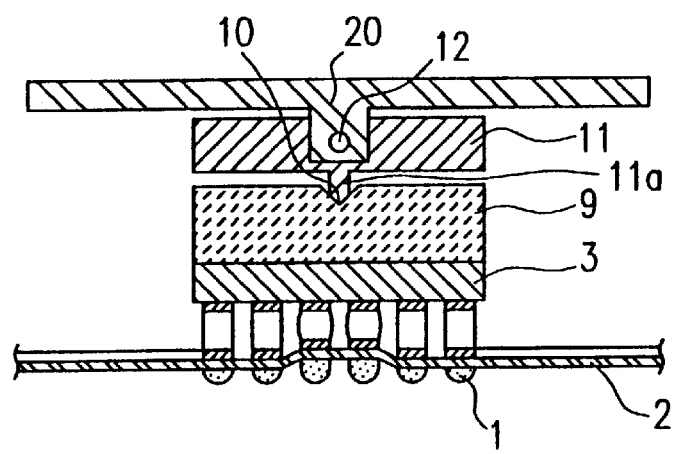
FIG. 8B illustrates the same portion of the probe card of FIG. 8A as viewed from a 90 degree shifted angle.
Figure 8C:
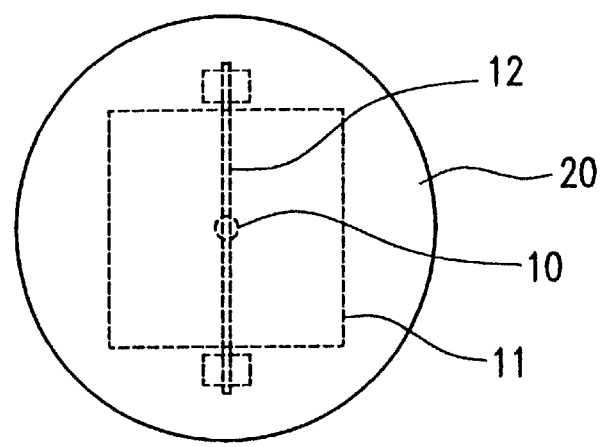
FIG. 8C is a top view illustrating the same portion of the probe card of FIG. 8A.

FIG. 8A is an enlarged cross-sectional view of FIG. 2 illustrating a portion of the probe card 100 around the contact bumps 1. FIG. 8B illustrates the same portion of the probe card 100 of FIG. 8A as viewed from a 90 degree shifted angle. FIG. 8C is a top view illustrating the same.

Referring FIGS. 8A, 8B, and 8C a securing plate holding mechanism 11 is secured to the third fixing ring 20 so as to be movable about a rotation axis 12. The rotation axis 12 is provided to be parallel to a diagonal line of the pad array of the DUT (not shown; see FIG. 2). The securing plate holding mechanism 11 is provided with a protrusion 11a for supporting a test chip securing plate 9 at a point (referred to with reference numeral 10) corresponding to the center 10 of gravity of the pad array of the DUT.

Such a structure allows the test chip 3 to be supported by the entire surface of the test chip securing plate 9, thereby preventing the test chip 3 from being damaged. Moreover, such a one-point supporting condition maintains the contact bumps parallel to the pads of the DUT, and a uniform load is applied to the pads of the DUT, thereby realizing an electrical contact with little resistance variation.

Figure 9A:
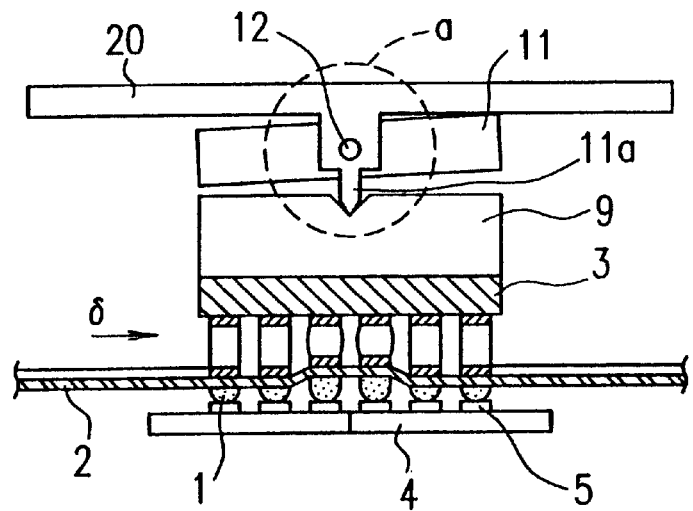
FIG. 9A schematically illustrates the contact bumps of the probe card of FIGS. 8A to 8C being in contact with the DUT.
Figure 9B:
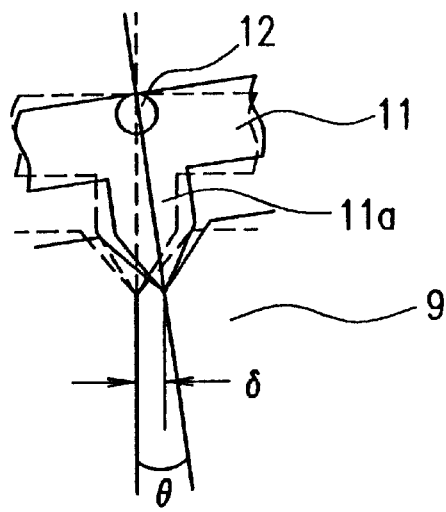
FIG. 9B is a schematic enlarged view illustrating a portion of the probe card as indicated by a dotted circle "a" in FIG. 9A.
Figure 9C:
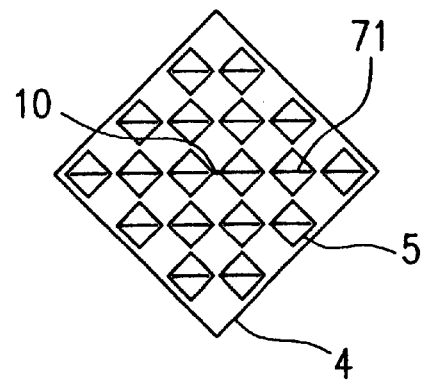
FIG. 9C is a schematic diagram illustrating the upper surface of the DUT after being scribed by the contact bumps.

Referring to FIGS. 9A to 9C, how the contact bumps 1 contact the pads 5 of the DUT 4 will be described. FIG. 9A schematically illustrates the contact bumps 1 being in contact with the DUT 4. FIG. 9B is a schematic enlarged view illustrating a portion of the structure around the rotation axis 12 (as indicated by a dotted circle "a" in FIG. 9A). FIG. 9C is a schematic diagram illustrating the upper surface of the DUT 4 after being scribed by the contact bumps 1.

When the contact bumps 1 are pressed against the DUT 4 by the third fixing ring 20, a force is generated so as to make the contact bumps 1 parallel to the pads 5 of the DUT 4, while another force is generated so as to rotate the securing plate holding mechanism 11 about the rotation axis 12. Referring to FIG. 9B, as the securing plate holding mechanism 11 rotates about the rotation axis 12 by an angle e, the rotation is transferred to the test chip securing plate 9 via the protrusion 11a as a horizontal movement by a distance 6. As a result, the contact bumps 1 are moved on the pads 5 of the DUT 4 by the distance δ in a direction perpendicular to the rotation axis 12 (i.e., the diagonal direction of the pads 5 of the DUT 4), thereby scribing the pads 5 in the diagonal direction. and leaving a scribed mark 71 on each pad 5, as illustrated in FIG. 9C.

The scribed mark 71 is a break in an oxide film on the surface of the pad 5, which provides satisfactory electrical connection between the contact bumps 1 and the pads 5. Since the scribe mark 71 extends in the diagonal direction of the pads 5 (i.e., a direction measuring a longer length within the pads 5), a large margin can be afforded for aligning the contact bumps 1 with respect to the pads 5.

(Method for controlling temperature of probe card)

Referring to FIG. 10, a structure for controlling the temperature of a probe card of the present invention will be described. FIG. 10 is a schematic cross-sectional view illustrating a probe card 150 which is similar to the probe card 100 illustrated in FIG. 2 but additionally includes a temperature control mechanism. The DUT 4 is omitted in FIG. 10 for simplicity but is assumed to be facing the probe card 150.

A temperature control of the probe card provides advantages such that: (1) the test chip 3 can be maintained at a predetermined constant temperature, thereby compensating for possible variation in the operating characteristics (e.g., a time delay) of the test chip 3 due to changes in temperature, and thus stabilizing the test accuracy; and (2) it is possible to maintain the DUT and the test chip 3 at the same constant temperature while testing the temperature characteristics of the DUT.

The probe card 150 of FIG. 10 is similar to the probe card 100 of FIG. 2 but additionally includes a hermetic lid 83. A coolant output pipe 82 and a coolant input pipe 84 are provided in the hermetic lid 83, which is fitted to the second fixing ring 19 via an O-ring 85 made of a rubber. A packing 89 is used to seal the contact between the second fixing ring 19 and the membrane 2. The hermetic lid 83, the second fixing ring 19 and the membrane 2 together form a hermetic chamber. The hermetic chamber is open to the atmosphere only via the coolant output pipe 82 and the coolant input pipe 84.

In the probe card 150 having such a structure, a temperature-controlled coolant such as pure water is injected through the coolant input pipe 84 and drained through the coolant output pipe 82, thus controlling the temperature of the hermetic chamber. The direction of the coolant flow is indicated by arrows in FIG. 10. A third fixing ring 81 includes a coolant passage hole 88 for circulating the coolant in the hermetic chamber. A test chip securing plate 86 adhered on the reverse side of the test chip 3 is provided with slits, thereby increasing the contact area between the plate 86 and the coolant so as to efficiently control the temperature of the test chip 3 (e.g., through heat radiation). In order to ensure the insulation between the contact bumps 1, an insulative resin such as a silicone rubber or an epoxy is filled in the space around the test chip pads 8 on the test chip 3, the connection bumps 7 and the bump electrodes 6.

The above-described structure makes it possible to control the temperature of the test chip 3 with a large heat capacity and thereby to rapidly bring the temperature of the test chip 3 to the predetermined constant temperature. It is also possible to control the temperature of the DUT via the contact bumps 1 to be equal to the temperature of the test chip 3. Moreover, it is also possible to prevent the temperature of the membrane 2 from rapidly changing, thereby minimizing a possible heat stress applied to components such as the DUT and the test chip 3.

The coolant is not limited to a liquid coolant, but may alternatively be a gaseous coolant as long as a desired heat exchange is realized. In the above-described example, the test chip 3 is cooled directly by the coolant. Alternatively, it is possible to allow the coolant to flow due to a heat flow in a heat pipe, or to allow a cooled gas to flow as the coolant. When the required heat capacity is relatively small, the temperature of the test chip 3 and the DUT can be controlled by providing the test chip securing plate 86 with a temperature control section such as a radiating fin or a Peltier element.

Furthermore, some specific examples of the test chip 3 will be described below.

(Exemplary structure of the test chip)

Figure 11:
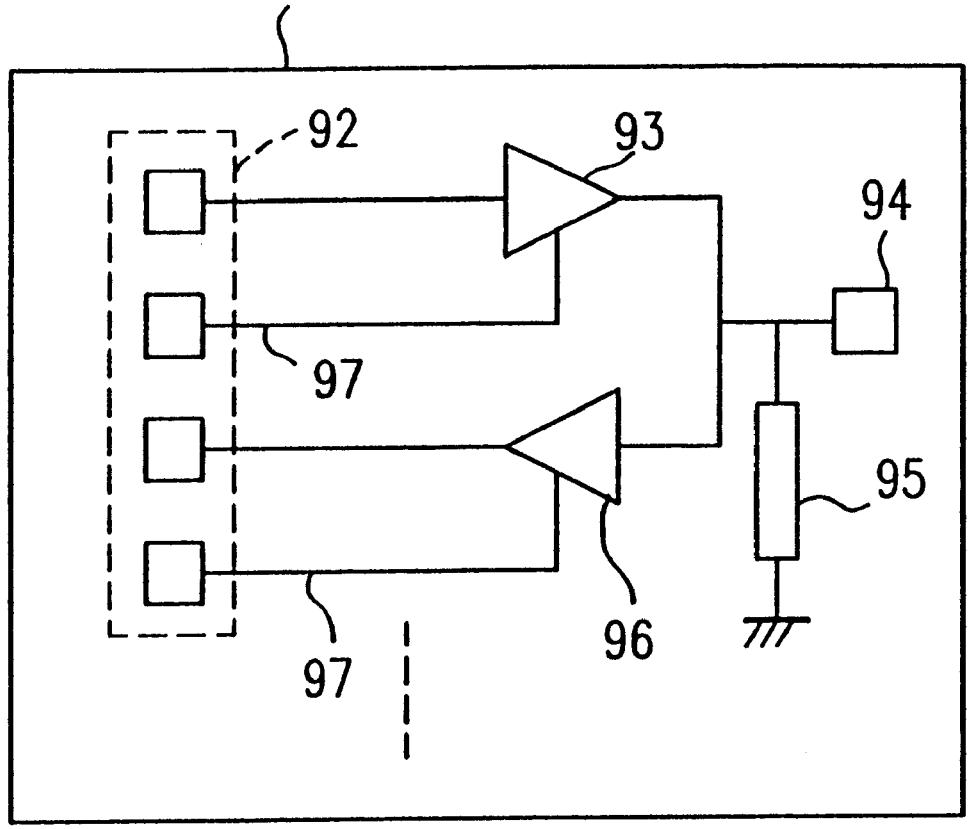
FIG. 11 is a schematic diagram illustrating a circuit structure of a test chip which can be used in the probe card of the present invention.

In the following structure of the test chip, two tester channels are provided to one I/O pin of the DUT in order to realize a high-speed test. FIG. 11 is a schematic diagram illustrating a circuit structure of a test chip 91 of this example.

Referring to FIG. 11, the test chip 91 includes a tester channel pad 92 and a device channel pad 94 for exchanging a signal with an external component. The tester channel pad 92 is connected to a signal test channel of the VLSI test system (see FIG. 3), and the device channel pad 94 is connected to a signal pad of the DUT (see, for example, FIG. 2) via the contact bumps 1. Note that FIG. 11 only illustrates components for one channel of the device channel pad 94 for simplicity. An actual test chip includes several hundred channels.

A load circuit 95 for impedance matching and current loading, an output of a driver tri-state buffer 93 and an input of a comparator tri-state buffer 96 are connected to the device channel pad 94, which is connected to the contact bumps 1. An input of the driver tri-state buffer 93, an output of the comparator tri-state buffer 96 and tri-state control inputs 97 of the tri-state buffers 93 and 96 are connected to the tester channel pad 92, which is connected to the tester channel.

Such a structure results in a very short distance between the pad of the DUT and the device channel pad 94, whereby a delay of a signal transferred therebetween can be ignored. Moreover, since a driving-and-strobing dedicated tester channel is connected to the single device channel pad, strobing and driving are always possible. Therefore, a dead zone, which otherwise occurs in the prior art during I/O switching when I/O signals are tested using a single tester channel (the length of the dead zone in time is 2 Td, where Td is a time delay in transferring a signal between the tester channel of the testing apparatus and the device pad), does not occur in the present invention. Thus, it is possible to test operating characteristics of the DUT in which an input and an output are rapidly switched (e.g., requiring a switching time equal to or less than 2Td), thereby increasing the operating speed of the test chip.

When the testing apparatus is programmed so that the tri-state control input of the comparator tri-state buffer 96 is always driven during a test, and the tri-state control input of the driver tri-state buffer 93 has a high impedance while the DUT is outputting signals, it is possible to avoid collision of the output from the testing apparatus and the output from the DUT.

When the testing apparatus is programmed so that the tri-state control input of the comparator tri-state buffer 96 has a high impedance, all the tester channel pads 92 can have the same impedance (i.e., all the tester channel pads 92 can become open-ended). Thus, a reflected wave at the tester channel pad of the tester channel can be known, thereby enabling measurement of the time delay.

(Another exemplary structure of the test chip)

Figure 12:
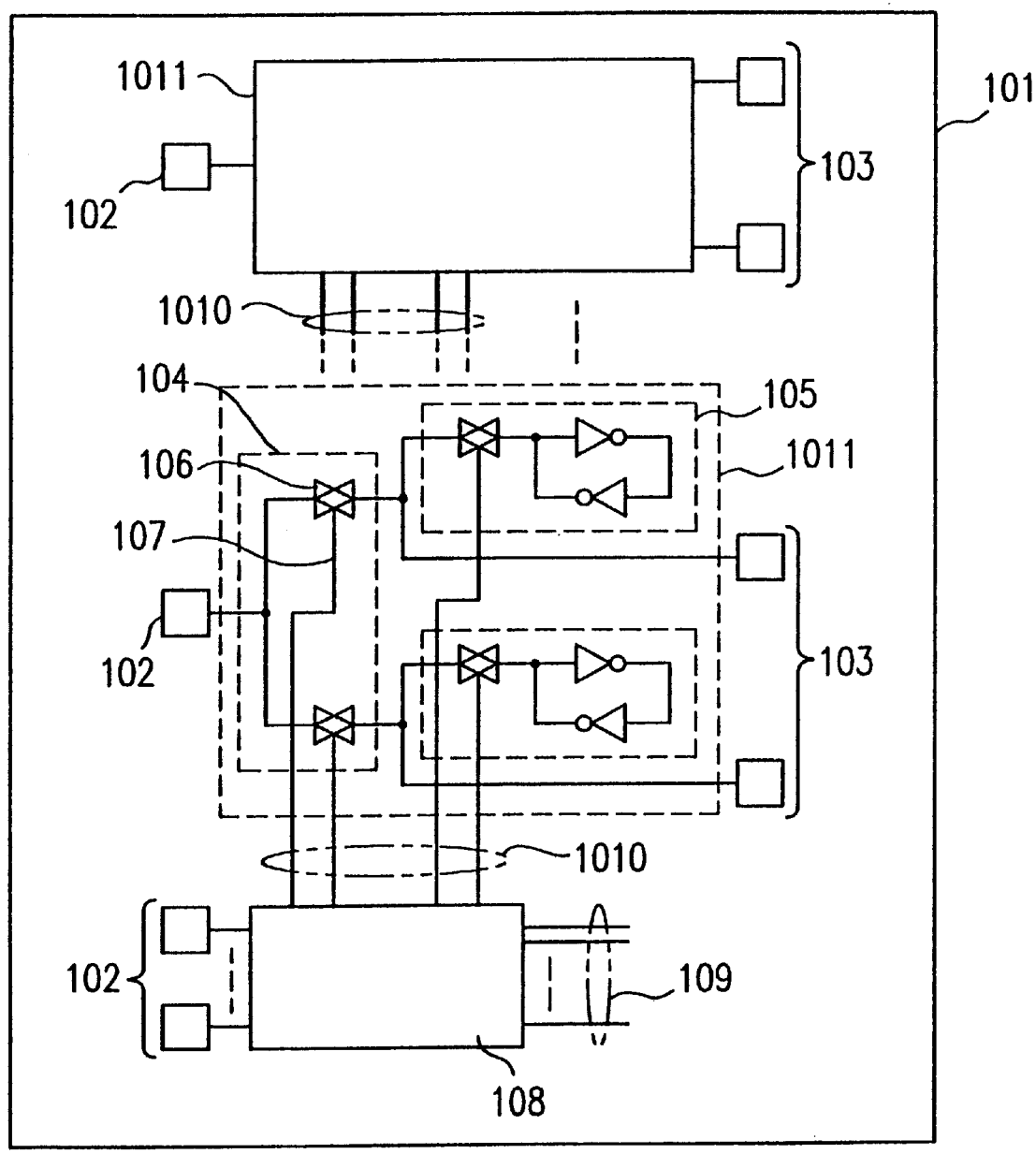
FIG. 12 is a schematic diagram illustrating another circuit structure of a test chip which can be used in the probe card of the present invention.

The following test chip structure realizes a test in which a tester channel is shared by a plurality of DUT pads when testing the operating characteristics of a high-speed, multiple-pin DUT. FIG. 12 is a schematic diagram illustrating a circuit structure of a test chip 101 of this example.

Referring to FIG. 12, the test chip 101 includes tester channel pads 102 and device channel pads 103. Two DUT signal pins connected to the device channel pads 103, respectively, are connected to a test channel circuit 1011 for one channel which is connected to the tester channel pad 102.

The structure and operation of the tester channel pads 102 will now be described.

A signal path from the tester channel pad 102 is divided into two branches in a bi-directional multiplexer 104. Each branch is provided with a signal latch circuit 105 for storing a signal from the signal pad of the DUT which is not being selected by the multiplexer 104. The connection between the multiplexer 104 and each signal latch circuit 105 is also connected to device channel pad 103. The signal latch circuit 105 including a transfer gate 106 and a pair of inverters performs writing and readout of data to and from the device channel pad 103 in response to opening and closing operations of the transfer gate 106. The bi-directional multiplexer 104 includes the transfer gates 106.

The tester channel pad 102 provides selection signals 1010 decoded by a selection signal generation circuit 108 as control signals 107 for controlling the transfer gates 106 of the signal latch circuit 105 and the bi-directional multiplexer 104.

An operation of the test chip 101 will now be described.

A normal operation test can be performed for the device channel pad 103 selected by the bi-directional multiplexer 104 which is connected to the tester channel. If the device channel pad 103 is being driven at this time, the value on the device channel pad 103 can be written to the signal latch circuit 105 by allowing the signal latch circuit 105 to be under the selected condition.

While the DUT is under the input condition, data can be read out from the device channel pad 103 which is not being selected by the bi-directional multiplexer 104 to fix the device input in a DC sense by placing the signal latch circuit 105 in selected condition. On the other hand, while the DUT is under the output condition, data can be written in the signal latch circuit 105. Since the distance between the bi-directional multiplexer 104 and the signal pad of the DUT is very short, data is rapidly written to or read out from the signal latch circuit 105, thereby realizing high-speed signal switching by the bi-directional multiplexer 104.

In such a structure, the single tester channel can be shared by a plurality of device channels in a time division manner by switching the connection of the bi-directional multiplexer 104 in real time. Therefore, it is possible to reduce the number of tester channels required for the testing apparatus. Moreover, the signal switching can be rapidly performed by providing the test chip with the above-described bi-directional multiplexer 104.

Although the bi-directional multiplexer 104 has two branches in the above-described example, the same effect can be obtained when the bi-directional multiplexer 104 has more than two branches.

Figure 13:
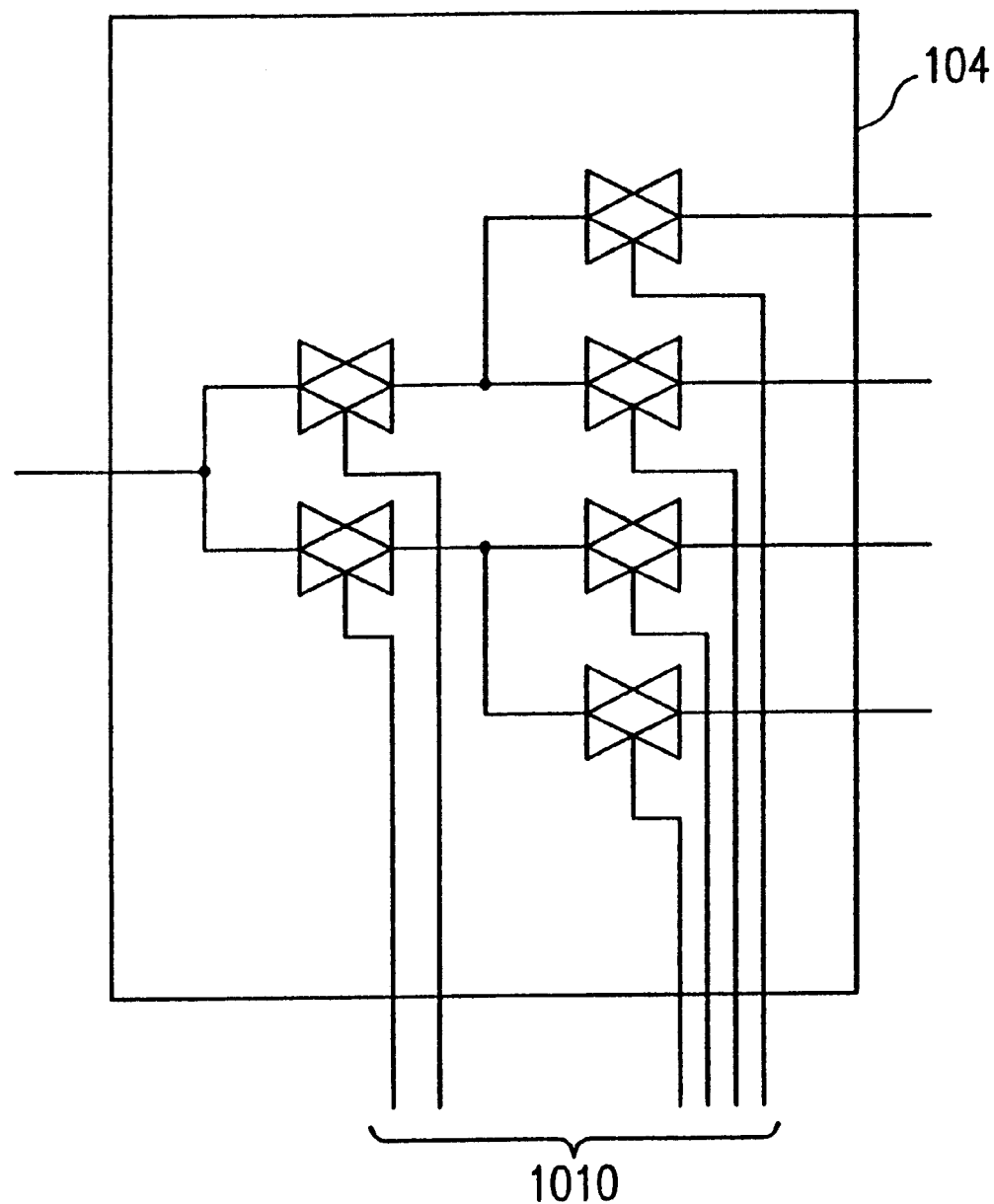
FIG. 13 is a schematic diagram illustrating an alternative circuit structure of a bi-directional multiplexer which can be used in the structure of FIG. 12.

For example, FIG. 13 schematically illustrates an alternative multiplexer 104 structure having four branches. With the multiplexer 104 structure illustrated in FIG. 13, four device channel pads can be provided for one tester channel pad, thereby more effectively utilizing the tester channel pad.

Moreover, when the multiplexer 104 is configured such that a plurality of tester channel pads branches to a common device channel pad, the tester channel pad is even more effectively utilized. However, when the number of branches is excessively large, the load capacity of the signal path increases, thereby deteriorating the quality of a signal waveform. The optimal multiplexer structure in terms of effective utilization of the tester channel pad may vary for different DUTs.

Figure 14:
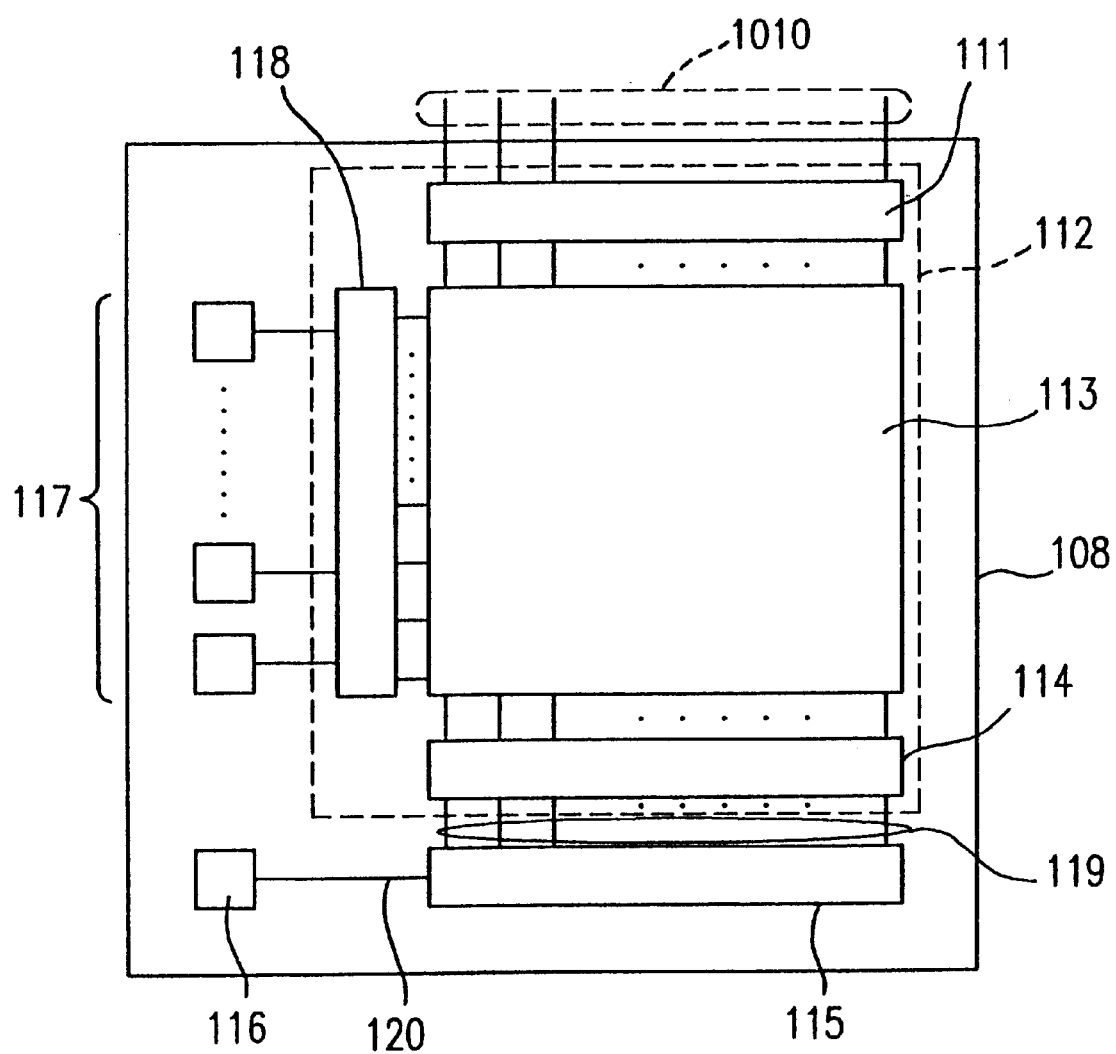
FIG. 14 is a schematic diagram illustrating an internal circuit structure of a selection signal generation circuit which can be used in the structure of FIG. 12.

Next, referring to FIG. 14, the selection signal generation circuit 108 provided in the test chip 101 will be illustrated in detail. In the selection signal generation circuit 108, a selection pattern is pre-stored in a memory in order to realize a high-speed operation.

Referring to FIG. 14, the selection signal generation circuit 108 includes a serial-parallel conversion circuit 115 as a bit width conversion circuit, and a memory circuit 112. The selection signals 1010 are stored in a memory array 113 of the memory circuit 112.

An operation for writing data which represent the selection signal 1010 (hereinafter, referred to also as "selection signal data") in the memory circuit 112 will be described below.

The selection signal data is written in the memory circuit 112 prior to and during a test for the DUT. In particular, an address in the memory circuit 112 is input as parallel data from an address input pad 117 via an address decoder 118. The selection signal data of the memory circuit 112 is input as serial data from a data input pad 116 connected to a serial input 120 of the serial-parallel conversion circuit 115. The input serial data passes through the serial-parallel conversion circuit 115 to be decoded into parallel data while, and then input to a write circuit 114 of the memory circuit 112 from a parallel output 119. The output of a read circuit 111 of the memory circuit 112 is used as the selection signal 1010.

In the selection signal generation circuit 108 having such a structure, the pre-stored data in the memory circuit 112 is read out by using an address signal from the testing apparatus, thereby generating the selection signal 1010. In such a structure, even when the number of signal lines for the selection signals 1010 is large, the required number of address signal lines is limited to correspond to the number of required combinations of the selection signals. Thus, it is possible to easily alter the correspondence between the address signal and the selection signal 1010 and to generate various selection signals 1010 at a high speed with little hardware resources.

It is also possible to reduce the number of tester channels required for the testing apparatus by writing the selection signal data of the selection signal generation circuit 108 to the memory circuit 112 from the testing apparatus via the serial-parallel conversion circuit 115. Furthermore, a switching signal for the bi-directional multiplexer can be generated at a high speed by using a small number of test channels.

It is understood that the specific circuit structures for the test chip as described above can be used individually or in combination.

As described above, in the probe card of the present invention, electrical connection between the pads of the DUT and the contact bumps is established by securely pressing the contact bumps formed on the front surface of the membrane against the DUT pads by the test chip from the reverse side of the membrane. Signals are transferred between the contact bumps and the testing apparatus via the test chip. Thus, it is possible to test operating characteristics of a high-speed IC device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A probe card for providing electrical connection between an IC device under test (DUT) and a testing apparatus, the probe card comprising:
   a test chip for transferring a signal between the DUT and the testing apparatus;
   a contact bump provided at a position corresponding to a pad of the test chip; and
   a test chip securing plate provided on a reverse surface of the test chip,
   wherein the test chip is provided to securely press the contact bump against the DUT by a load applied to the reverse surface of the test chip from the test chip securing plate, thereby establishing the electrical connection between the DUT and the contact bump.

2. A probe card according to claim 1, further comprising a membrane provided between the contact bump and the test chip, wherein:
   the membrane has wiring for electrically connecting the contact bump, the test chip and the testing apparatus to one another; and
   the test chip securely presses the contact bump against the DUT from a reverse side of the membrane.

3. A probe card according to claim 2, wherein:
   a bump electrode is provided on the reverse side of the membrane so as to be connected to the contact bump;
   the test chip is flip-chip mounted to the bump electrode with a connection bump; and
   height variation among the contact bumps is compensated for by a change in height of the connection bump resulting from deformation thereof, whereby an uneven surface defined by tips of the contact bumps is aligned with a surface defined by the pads of the DUT.

4. A probe card according to claim 3 wherein the uneven surface defined by tips of the contact bumps is prefixed so as to be aligned with the surface defined by the pads of the DUT.

5. A probe card according to claim 2, wherein:
   a bump electrode is provided on the reverse side of the membrane so as to be connected to the contact bump;
   the test chip is flip-chip mounted to the bump electrode via a bumper electrode array including an insulative elastic body and a plurality of relay electrodes running through the insulative elastic body; and
   height variation among the contact bumps is compensated for by the bumper electrode array having a variable thickness, whereby an uneven surface defined by tips of the contact bumps is aligned with a surface defined by the pads of the DUT.

6. A probe card according to claim 1, the test chip comprising:
   a. plurality of tester channel pads to which a plurality of tester channels of the testing apparatus are connected, respectively;
   a plurality of device channel pads connected to the contact bumps, respectively; and
   a tri-state buffer,
   wherein one of the tester channel pads which is used only for inputting a signal to the testing apparatus and another one of the tester channel pads which is only used for outputting a signal from the testing apparatus are connected to one of the device channel pads via a tri-state buffer as a pair of the tester channel pads; and
   a tri-state control input for the tri-state buffer is connected to the tester channel pad and is controlled directly by the testing apparatus.

7. A probe card according to claim 6, wherein a load circuit is connected to the device channel pad in the test chip.

8. A probe card according to claim 6, the test chip comprising:
   a plurality of bi-directional multiplexers for selectively connecting signals from the tester channel pads to the plurality of device channel pads; and
   a selection signal generation circuit for receiving the signals from the tester channel pads as an input and providing a selection signal to the bi-directional multiplexers.

9. A probe card according to claim 8, wherein:
a signal latch circuit is connected to the device channel pad for storing a signal on the device channel pad; and
the signal latch circuit is selectively disconnected from the device channel pad in response to the selection signal from the selection signal generation circuit.

10. A probe card according to claim 8, wherein: the selection signal generation circuit of the test chip includes a bit width conversion circuit and a memory circuit;
the bit width conversion circuit increases a bit width of data to be input to the tester channel pad and writes the data in the memory circuit;
the selection signal is generated from an output of the memory circuit; and
an address signal of the memory circuit is input through the tester channel pad.

11. A probe card according to claim 1, further comprising:
a securing plate holding mechanism for supporting the test chip securing plate,
wherein the securing plate holding mechanism is supported about a rotational axis perpendicular to a longitudinal direction of the pads of the DUT.

12. A probe card according to claim 11, wherein the securing plate holding mechanism supports the test chip securing plate at the center of gravity of the pads of the DUT.

13. A probe card according to claim 11, further comprising a temperature control section provided on the test chip securing plate, wherein the temperature control section is used to control a temperature of the test chip.

14. A probe card for providing electrical connection between an IC device under test (DUT) and a testing apparatus, the probe card comprising:
a test chip for transferring a signal between the DUT and the testing apparatus;
a contact bump provided at a position corresponding to a pad of the test chip:
a test chip securing plate provided on a reverse surface of the test chip, and
a securing plate holding mechanism for supporting the test chip securing plate,
wherein the test chip is provided to securely press the contact bump against the DUT, thereby establishing the electrical connection between the DUT and the contact bump; and
wherein the securing plate holding mechanism is supported about a rotational axis perpendicular to a longitudinal direction of the pads of the DUT.

15. A probe card according to claim 14, wherein the securing plate holding mechanism supports the test chip securing plate at a center of gravity of the pads of the DUT.

16. A probe card according to claim 14, further comprising a temperature control section provided on the test chip securing plate, wherein the temperature control section is used to control a temperature of the test chip.

17. A probe card for providing electrical connection between an IC device under test (DUT) and a testing apparatus, the probe card comprising:
a test chip for transferring a signal between the DUT and the testing apparatus;
a contact bump provided at a position corresponding to a pad of the test chip;
a membrane provided between the contact bump and the test chip;
a hermetic structure provided on the reverse side of the membrane; and
an insulative coolant filled in the hermetic structure into which the test chip is placed,
wherein the test chip is provided to securely press the contact bump against the DUT, thereby establishing the electrical connection between the DUT and the contact bump;
the membrane has wiring for electrically connecting the contact bump, the test chip and the testing apparatus to one another;
the test chip securely presses the contact bump against the DUT from a reverse side of the membrane; and
temperature control for the membrane and the test chip is performed by controlling a temperature of the coolant.

\* \* \* \* \*

UNITED STATES PATENT AND TRADEMARK OFFICE
CERTIFICATE OF CORRECTION

PATENT NO. : 6,181,145 B1
DATED : January 30, 2001
INVENTOR(S) : Tomita et al.

It is certified that error appears in the above-identified patent and that said Letters Patent is hereby corrected as shown below:

Title page,
Item [54], the title should read: -- PROBE CARD FOR ELECTRICALLY CONNECTING DEVICE UNDER TEST WITH TESTING APPARATUS --

Signed and Sealed this

Thirtieth Day of October, 2001

Attest:

NICHOLAS P. GODICI
Attesting Officer    Acting Director of the United States Patent and Trademark Office